United States Patent [19]
Sugawara

[11] Patent Number: 5,781,060
[45] Date of Patent: Jul. 14, 1998

[54] SEMICONDUCTOR INTEGRATED CIRCUIT DEVICE HAVING A VARIABLE CURRENT SOURCE CONTROLLED BY A SHIFT REGISTER

[75] Inventor: Mitsutoshi Sugawara, Tokyo, Japan

[73] Assignee: NEC Corporation, Tokyo, Japan

[21] Appl. No.: 827,418

[22] Filed: Mar. 27, 1997

[30] Foreign Application Priority Data

Mar. 29, 1996 [JP] Japan ................................. 8-076087

[51] Int. Cl.[6] .................................................. H03K 17/62
[52] U.S. Cl. ........................ 327/407; 327/355; 327/361; 327/403
[58] Field of Search ............................ 327/355, 361, 327/403, 405, 407; 341/144, 146, 153

[56] References Cited

U.S. PATENT DOCUMENTS

| | | |
|---|---|---|
| 3,582,943 | 6/1971 | Weller ................................. 340/347 |
| 4,405,916 | 9/1983 | Hornak et al. ................... 340/347 DA |
| 4,535,257 | 8/1985 | Hareyama ............................. 307/362 |
| 4,935,740 | 6/1990 | Schouwenhaars et al. ........... 341/135 |
| 5,004,901 | 4/1991 | Yoshimoto et al. ................ 250/201.5 |
| 5,022,051 | 6/1991 | Crandall et al. ...................... 375/19 |
| 5,059,836 | 10/1991 | Lee et al. ............................ 307/520 |
| 5,469,101 | 11/1995 | Yepp .................................. 327/361 |

Primary Examiner—Timothy P. Callahan
Assistant Examiner—Jung Ho Kim
Attorney, Agent, or Firm—Sughrue, Mion, Zinn, Macpeak & Seas, PLLC

[57] ABSTRACT

A semiconductor integrated circuit device includes a variable current source 2. This device further includes a control circuit 1, 10 causing the current source to change the value of the current produced therefrom in response to a set of control signals, and a shift register 13 serially receiving control data and produces the set of control signals in a parallel form.

4 Claims, 6 Drawing Sheets 5,781,060

1

SEMICONDUCTOR INTEGRATED CIRCUIT DEVICE HAVING A VARIABLE CURRENT SOURCE CONTROLLED BY A SHIFT REGISTER

BACKGROUND OF THE INVENTION

1. Field of the Invention

The present invention relates to a semiconductor integrated circuit device and, more particularly, to such a device that has a variable current source producing a current whose value is controllable in accordance with an application field such as a magnetic head, a filter and the like.

2. Description of the Related Art

Heretofore, there have been known various kinds of integrated circuit devices in which analog quantities such as output voltage and frequency are internally set in advance and are selected in response to operating mode or the like. For example, in the case of the drive current of a magnetic head and an optical head, these magnetic/optical heads are driven, depending upon their type, at several kinds of current value for various modes according to the recording density or the like. Furthermore, in the case of an oscillator, the center frequency thereof is selectable corresponding to the mode or channel. In general, such control or selection is made by changing or controlling an operating current flowing through a target circuit.

The further description will be made below on a recording amplifier for magnetic head drive as an example with reference to FIG. 5. This amplifier includes a current generation circuit 100 which generates a controllable current i in response to control signals CL1 and CL2. This current i is supplied to a driver circuit 3 which drives a magnetic head coil 40 connected to terminals HX and HY in response thereto. The coil 40 has an intermediate tap supplied with a power voltage Vcc.

The current generation circuit 100 includes a decoder 11 which generates control voltages V1 to V4 by decoding the control signals CL1 and CL2, transistors Q101 to Q104 whose respective bases receive a reference voltage VR and whose respective collectors are connected in common to generate the current i. The circuit 100 further includes MOS transistors Q111 to Q114 whose drains are connected respectively to the emitters of the transistors Q101 to Q104, whose gates are supplied respectively with the control voltages V1 to V4, and whose sources are connected respectively to terminals 101 to 104. The terminals 101 to 104 are in turn grounded through external resistors R101 to R104, respectively.

The driver circuit 3 includes current mirror circuits 31 and 32 which generate a drive current I in response to the current value i, and transistors Q1 and Q2 whose emitters are connected in common to receive the drive current I. The collectors of the transistors Q1 and Q2 are connected respectively to terminals HX and HY, and a data write-control signal is supplied between the bases thereof. In operation, in order to obtain a desired bias current, the control signals CL1 and CL2 are supplied to the decoder 11 which in turn activates one of the control voltages V1 to V4 to the high level. Assuming that the control signal V3 is driven to the high level, the transistor Q113 is made conductive, so that a current determined by the resistor R103 is generated as the output current i. This current i is represented by $(V_R - V_{BE})/R103$ where $V_{BE}$ indicates the base-emitter voltage VBE (about 0.7 V) of the bipolar transistor. The current mirror circuits 31 and 32 generate the drive current I corresponding to the current i, and supplies

2 it to the driving transistors Q1 and Q2 constituting the differential circuit. Either one of the transistors Q1 or Q2 is turned ON in response to the write signal to supply the drive current I to the magnetic head coil 40 via the terminal HX or HY.

As is apparent from the above description, the current i or I can be controlled by the resistance values of the resistors R101 to R104. These resistors R101 to R104 are required to be provided as an external element outside an IC, in order to obtain a precise value and/or a variable value. For this reason, a set employing the IC is made expensive.

In order to solve the above problem, the present inventors has conceived such an integrated circuit as shown in FIG. 6 which obviates external resistors. In FIG. 6, components identical to those in FIG. 5 are shown with the identical symbols to omit the further description thereof.

This IC includes a programmable logic array (PLA) circuit 10 and a digital-to-analog converter (DAC) circuit 2 in place of the current generation circuit 100 as shown in FIG. 5.

The PLA circuit 10 includes a decoder 11 and transistors Q31–Q36, Q41–Q46, Q51–Q56, and Q61–Q66 which are arranged in matrix form of rows and columns. The collectors of the transistors are connected to a power supply Vcc. The bases of the transistors arranged in the same row, Q31–Q36, Q41–Q46, Q51–Q56, Q61–Q66 are connected in common to receive an associated one of control voltages V1 to V4. On the other hand, selected ones of the emitters of the transistors arrayed in the same column, transistors Q31, Q41, Q51, and Q61, transistors Q32, Q42, Q52, and Q62, transistors Q33, Q43, Q53 and Q63, transistors Q34, Q44, Q54, and Q64, transistors Q35, Q45, Q55, and Q65, and transistors Q36, Q46, Q56, and Q66 are connected in common to a corresponding one of output nodes P1 to P6. Note here that in FIG. 6 each of the emitters of all the transistors Q31–Q36, Q41–Q46, Q51–Q56, and Q61–Q66 are connected to a corresponding one of the nodes P1 to P6, but only selected transistor or transistors are connected at the emitter or emitters thereof to the corresponding node P in accordance with a desired value of a current to be outputted. This is done during the process of fabricating this IC as PLA.

The DAC circuit 2 includes transistors Q21 to Q26 supplied in common at the respective bases with a reference voltage VB and connected in common at respective collectors to output a current i. The DAC 2 further includes transistors Q11 to Q16 supplied at respective bases with a reference voltage VR, and the collectors thereof are connected respectively to the nodes N1 to N6 to which the emitters of transistors Q21 to Q26 are also connected respectively. The emitters of the transistors Q11 to Q16 are grounded through resistors R11 to R16, respectively. The relations in resistance values among the resistors R11 to R16 are as follows:

R15=2R16, R14=4R16, R13=8R16, R12=16R16, and R11=32R16.

Thus, each of the transistors Q11 to Q16 constitute a weighted current source which produces a current determined by the emitter voltage thereof (=VR-VBE) and the resistance value of the corresponding resistor R. Each of the transistors Q21 to Q26 cooperates with the PLA 10 to constitute a differential switch circuit. Accordingly, each of the transistors Q11 to Q16 is supplied with a current from the PLA 10 or the transistors Q21 to Q26.

In the PLA circuit 10, the decoder 11 decodes the control signals CL1 and CL2, and brings one of the control voltages V1 to V4 to the high level. Assuming that the voltage V1 is brought to the high level and that the emitter of the transistor Q36 is in fact disconnected from the node P6, the transistor Q26 is rendered conductive, so that the current flowing through the transistor Q16 is derived as the output current i. On the contrary, if the emitter of the transistor Q36 is actually connected to the node P6 and the signal V1 takes the high level, no current is produced as the current i. Thus, by designing the PLA 10, it is possible to output an arbitrarily current i corresponding to the decoded control voltages V1 to V4.

In this way, it is possible to eliminate the external resistors and reduce the number of terminals, thus becoming inexpensive. It is also possible to realize more functions than the circuit of FIG. 5.

However, once the IC as shown in FIG. 6 is fabricated, the drive current I is fixed and no more changeable. It is often required to further control a drive current I in response to actual characteristics of the waveform or noise or the object head to be driven or to the characteristic of the read circuit. In this case, the information to be set into the PLA 10 is required to be re-designed, so that cost is increased and delivery time is prolonged.

SUMMARY OF THE INVENTION

It is therefore an object of the present invention to provide an improved integrated circuit device.

It is another object of the present invention to provide an IC having a variable current source in which a current is adjustable without a PLA circuit and external elements.

A semiconductor device according to the present invention includes a variable current source producing a variable current, a shift register receiving control data in serial and producing a set of control signals, and a control circuit responding to the set of control signal to cause the variable current source to change or adjust the variable current.

With the above construction, the current which is actually produced by the current source is changed or adjusted in accordance with the set of control signal, i.e., with the control data serially supplied to the shift register. In other words, the value of the current is dependent on the contents of the control data. Accordingly, the contents of the control data corresponding to the current which is required to satisfy the device characteristics can be obtained easily. That content can be reflected as the information to be written into a PLA circuit of the IC as shown in FIG. 6. Thus, there is no need to re-design for obtaining a desired current.

BRIEF DESCRIPTION OF THE DRAWINGS

The above and other objects, advantages, and features of the present invention can be apparent from the following description taken in conjunction with the accompanying drawings, in which.

DESCRIPTION OF THE PREFERRED EMBODIMENTS

Figure 1:
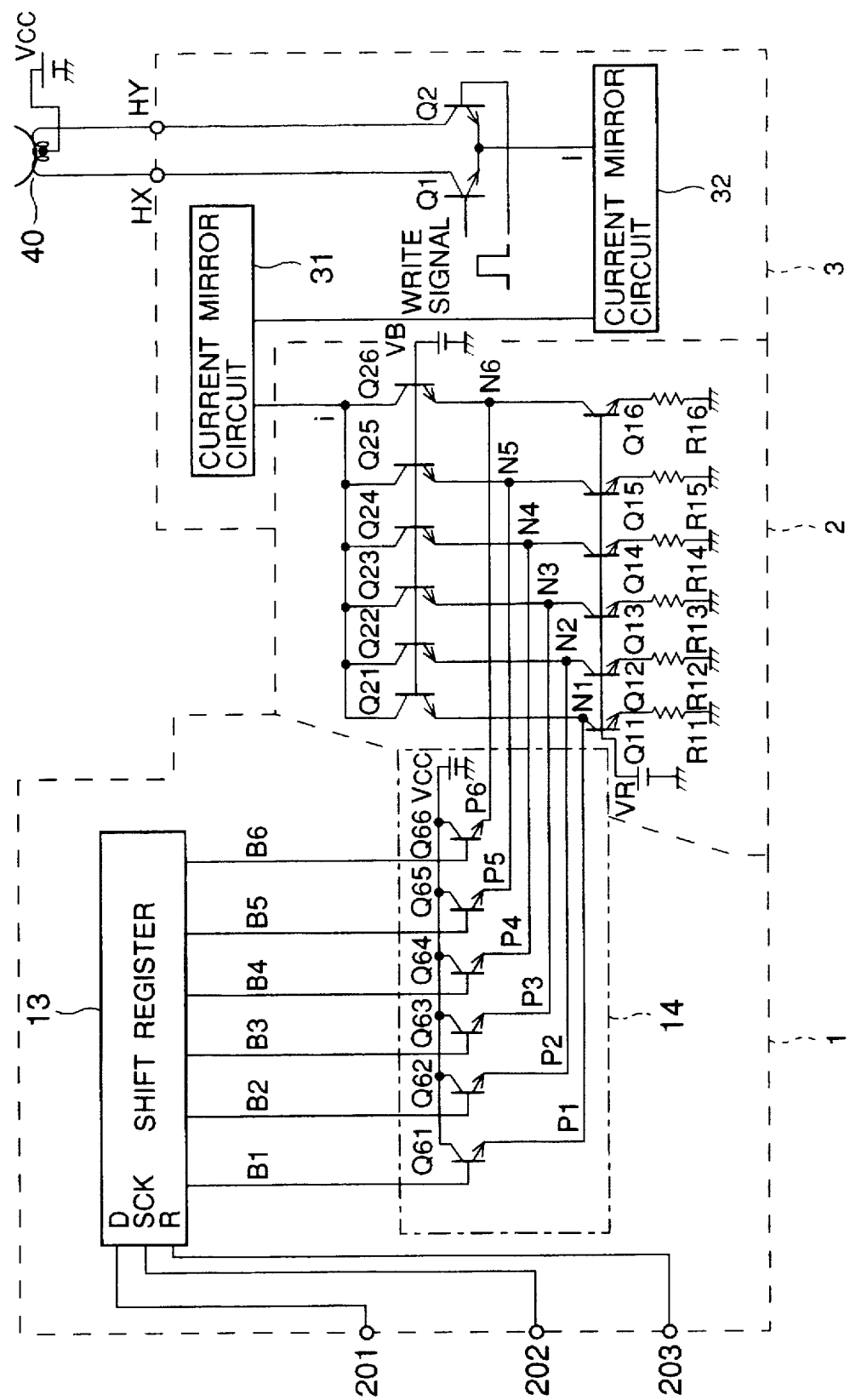
FIG. 1 is a circuit diagram illustrative of a first embodiment of the present invention.
Figure 6:
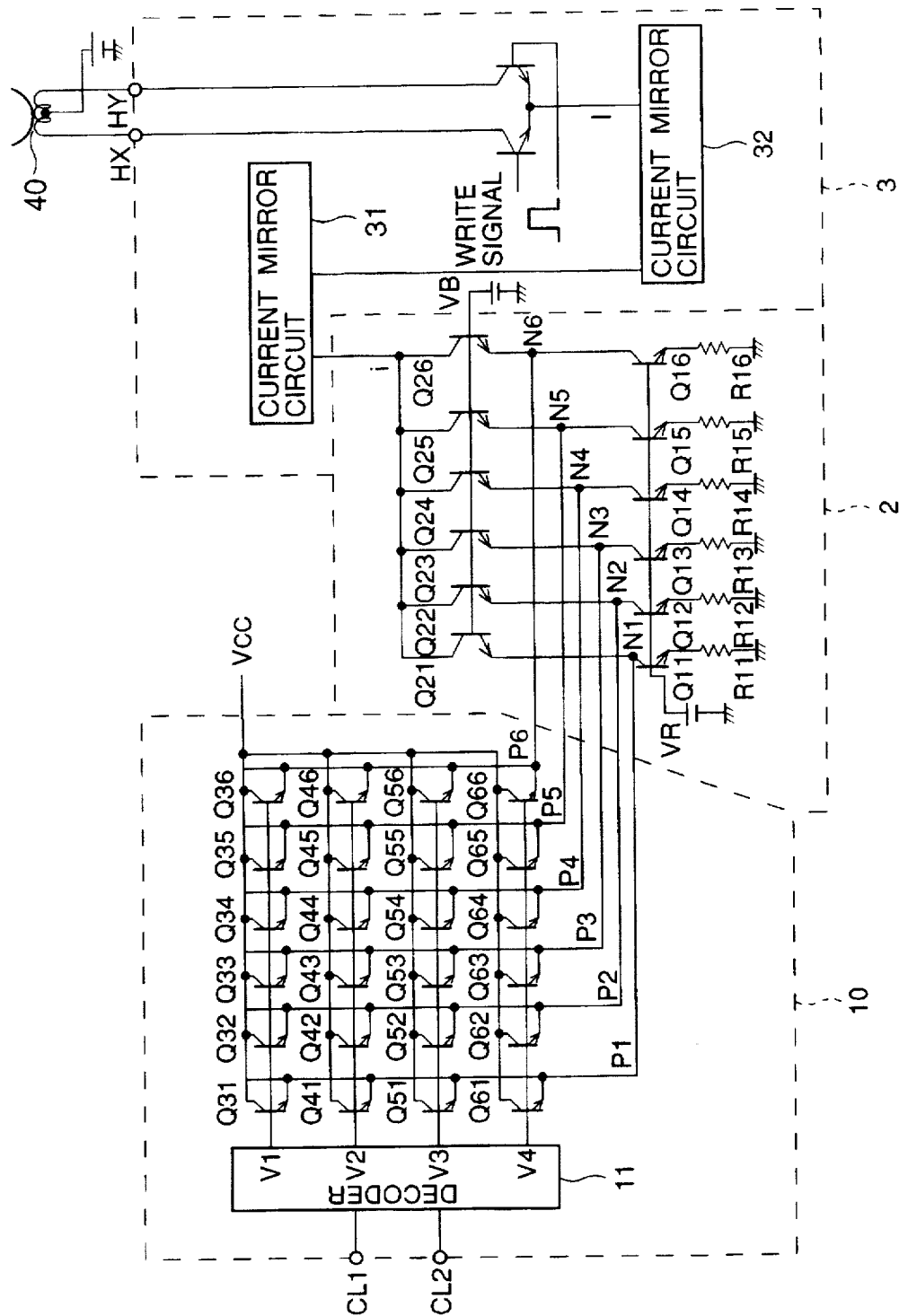
FIG. 6 is a circuit diagram illustrative of an IC which the inventor has first conceived in order to overcome the problems of the circuit as shown in FIG. 5.

Referring now to FIG. 1, there is shown an IC according to the first embodiment of the present invention, in which components identical to those in FIG. 6 are shown with identical symbols to omit the further description thereof. Note that the IC shown in FIG. 1 is used to obtain the information to be written into the PLA 10 of the IC as shown in FIG. 6.

Referring to FIG. 1, in place of PLA circuit 10 in FIG. 6, this circuit comprises a current setting circuit 1 which consists of a shift register 13 and a switch circuit 14. The shift register 13 receives a data signal D in serial in synchronism with a shift clock SCK and output a set of control signals B1 to B6 in a parallel form. The data signal D and the shift clock SCK are supplied from an external tester through terminals 201 and 202. The switch circuit 14 includes transistors Q61 to Q66 whose collectors are connected in common to receive a power supply voltage VCC, whose emitters are connected respectively to nodes N1 to N6 of the DAC 2, and whose bases are supplied respectively with the outputs B1 to B6 of the shift register 13. The transistors Q61 to Q66 constitute a differential switch circuit with the transistors Q21 to Q26, respectively.

In operation, the control data D is supplied to the shift register 13 in serial, so that each of the digital signals B1 to B6 takes one of logic 1 and 0. Assuming that only the signal B6 is 0, only the transistor Q26 is rendered conductive. Consequently, a current flowing through the transistor Q16 is derived as the current i, and accordingly as the drive current I.

On the other hand, each of the signals B1 to B6 takes "1", none of the transistors Q21 to Q26 is turned ON, so that no current is produced as the drive current I.

In this way, the control signals B1 to B6 can control the value of the drive current I. Accordingly, by trying various data through interchange of the data for the shift register 13, it is possible to obtain data for which the value of the current is a desired value. Using the data thus obtained, the PLA connection information in FIG. 6 is obtained.

Figure 2:
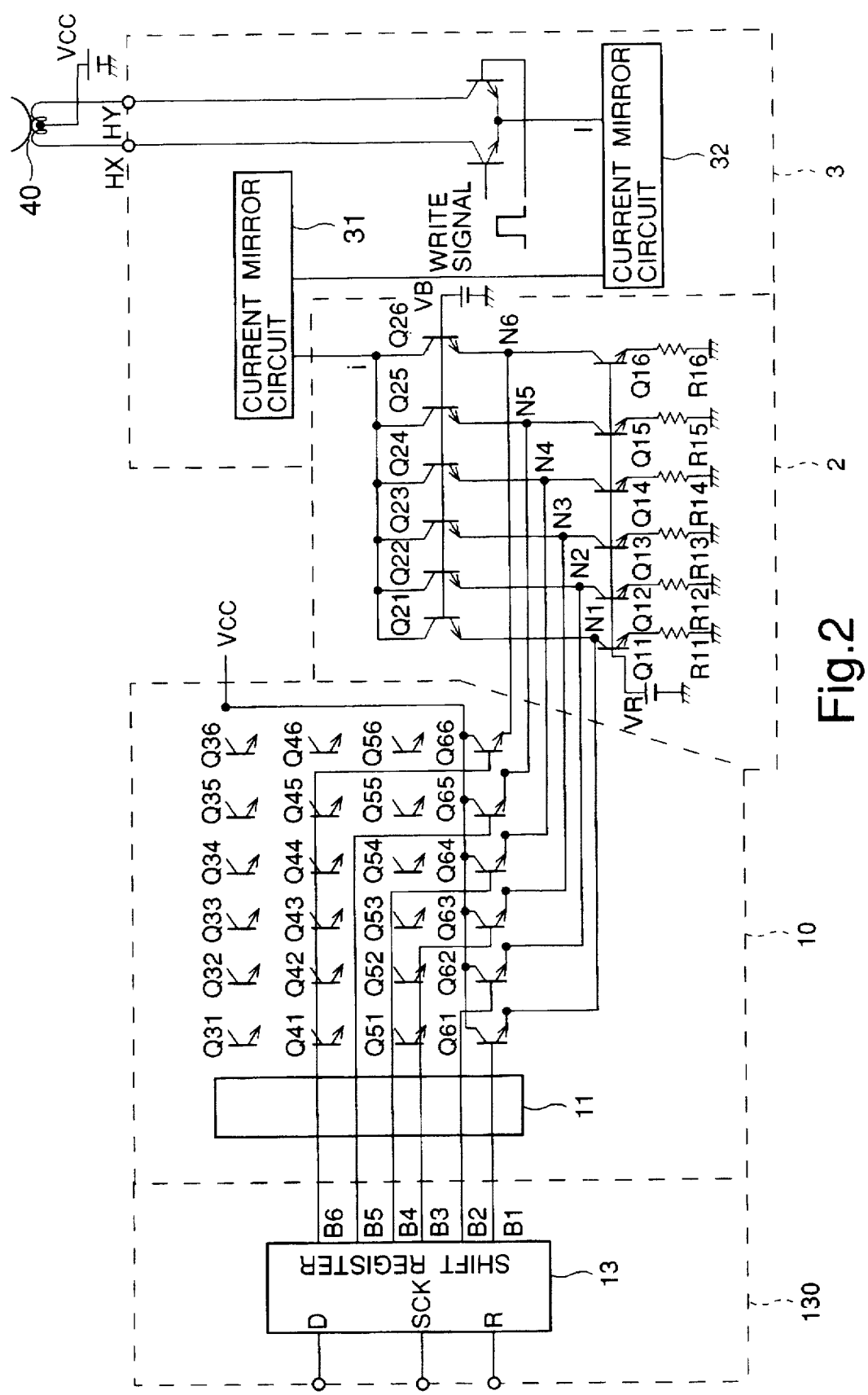
FIG. 2 is a circuit diagram illustrative of a second embodiment of the present invention.

Turning to FIG. 2, the IC according to the second embodiment of this invention includes an extra chip area 130 in which the shift register 13 is formed. Moreover, the transistors for a switch circuit 14 (see FIG. 1) are constituted by the transistors Q61 to Q66 in the PLA 10. The output signals B1 to B6 of the shift register 13 are supplied respectively to bases of the transistors Q61 to Q66. These are done for matching the characteristics of FIG. 2 with those of FIG. 6.

Figure 3A:
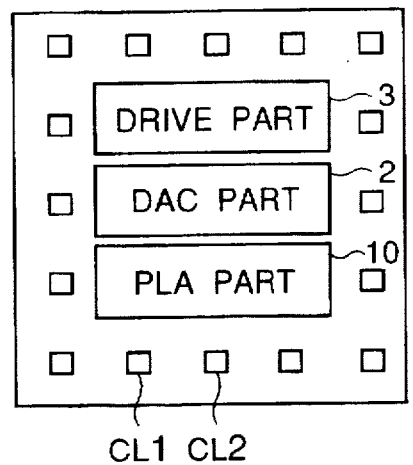
FIG. 3A and FIG. 3B are layout diagrams of circuits shown in FIG. 6 and FIG. 2.
Figure 3B:
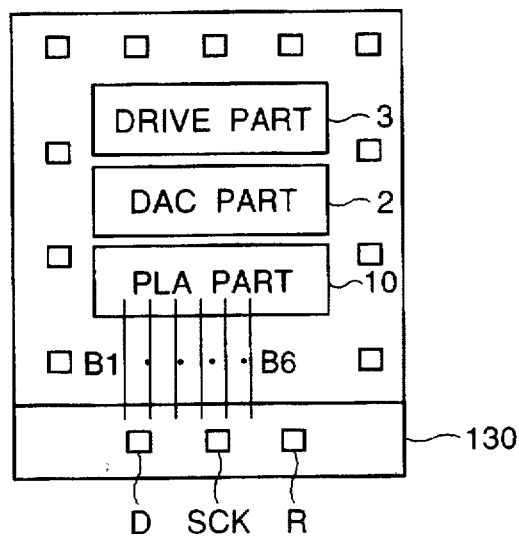

In pattern layout of the chip, the IC shown in FIG. 6 has such a pattern layout as shown in FIG. 3A, whereas the IC shown in FIG. 2 has such a pattern layout as shown in FIG. 3B.

According to the present embodiment, a very high efficiency of production can be achieved since the masks the same as for the circuit in FIG. 6 can be utilized except for the wirings in the current setting part 1.

It is required to prepare identical mask patterns, packages and the patterns for printed circuit board on which the chip are mounted except for the current setting part 1 in order that the identical analog characteristics for the integrated circuit in FIG. 6 and the integrated circuit for evaluation (circuit in FIG. 1 or FIG. 2) are obtained.

The shift register 13 is constituted by, for example, cascade-connecting pieces of known master-slave type D flip-flop (equivalent to two pieces of D latch (flip-flop)) corresponding to the number of bits, namely, corresponding to six bits in these embodiments.

However, according to this configuration, the circuit scale becomes relatively large, so that when the bit number is large, the space factor of this portion on the mask becomes large.

Figure 4:
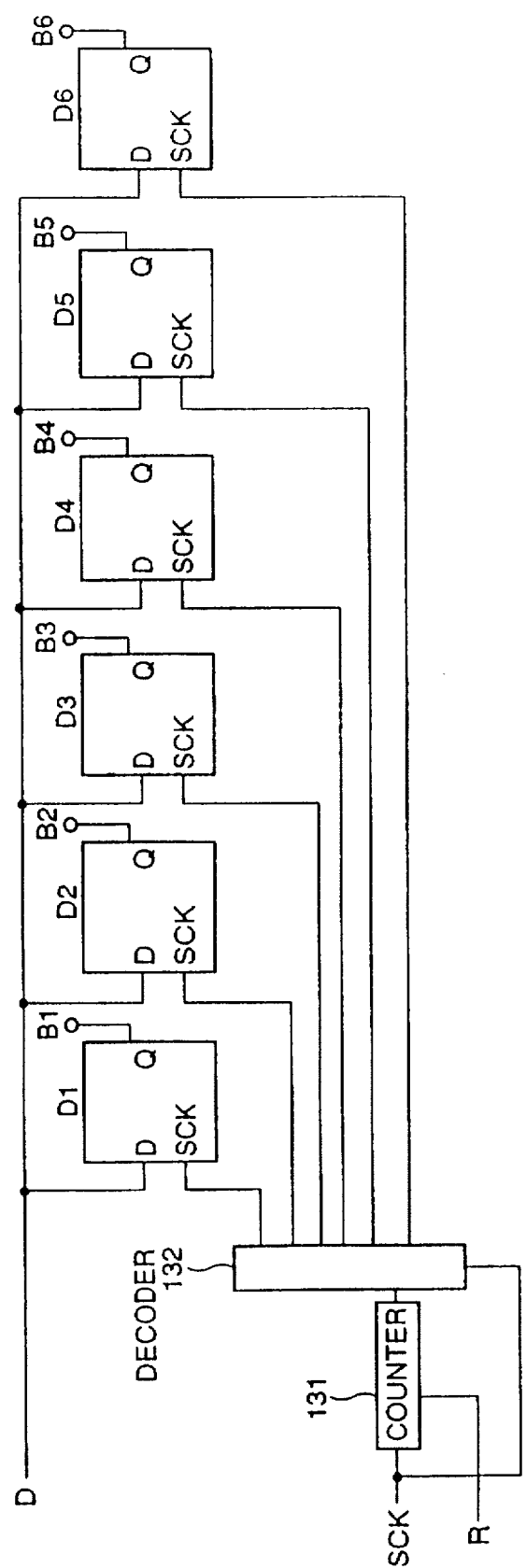
FIG. 4 is a circuit diagram indicative of a shift resistor shown in FIG. 1 and FIG. 2.
Figure 5:
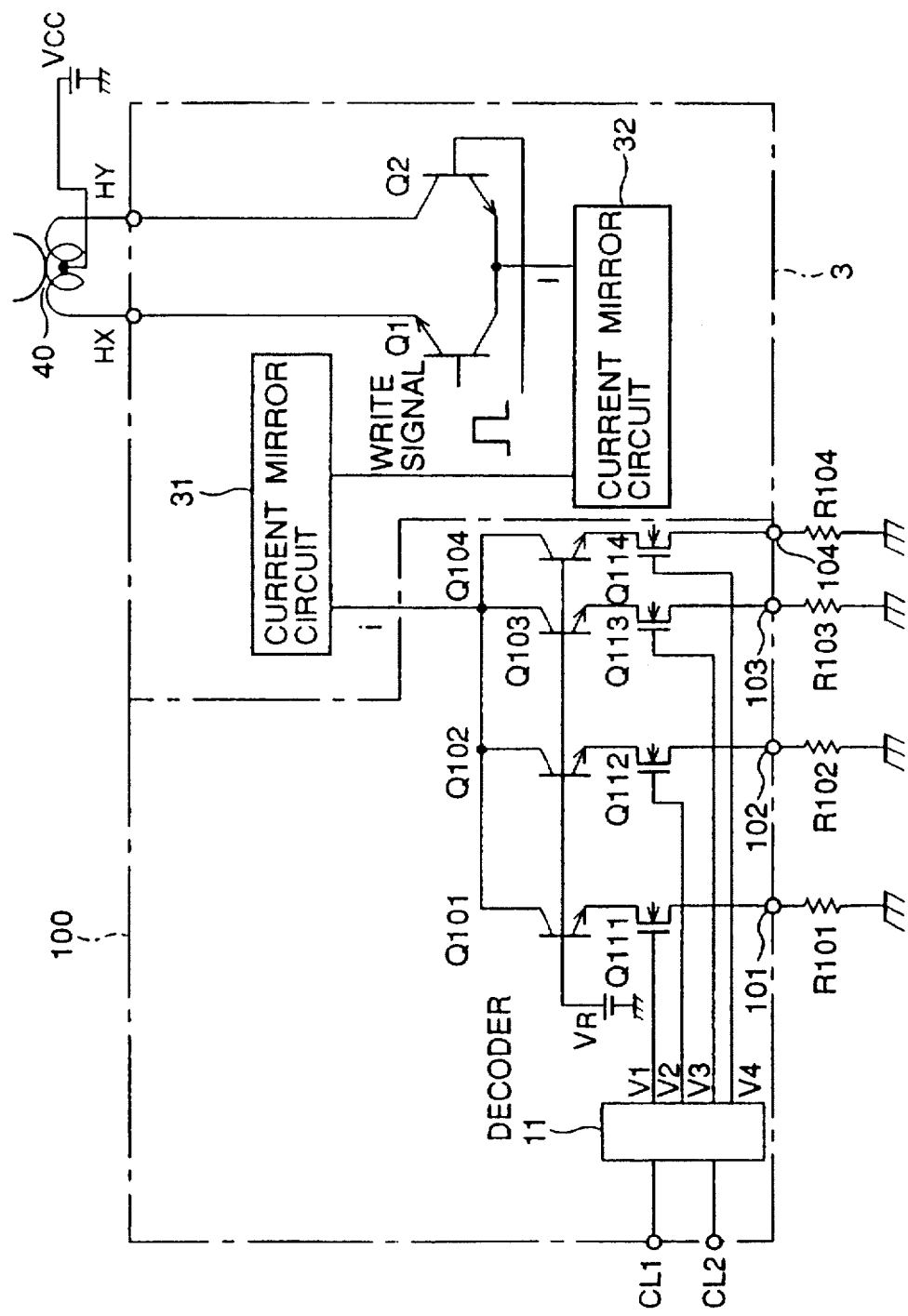
FIG. 5 is a circuit diagram illustrative of the prior art.

To avoid this, a circuit as shown in FIG. 4 may be utilized as a shift register 13. Referring to FIG. 4, the shift register 13 is constituted of six pieces of D latches D1 to D6, a counter 131 which counts the shift clock SCK and outputs the counted value and a decoder 132 which decodes the counted value and supplies the result to each of the D latches D1 to D6. Besides a reset signal R is input into the counter 131.

To described the operation of the shift register 13 in FIG. 4, the counter 131 counts the shift clock SCK and supplies the counted value to the decoder 132, the decoder 132 decodes the counted value and selects either one of the D latches D1 to D6 and latches data D in a D latch of a desired number. Respective outputs of the D latches D1 to D6 become the data B1 to B6. The area required can be ½ +α times (α corresponds to the counter 131 and the decoder 132) the area in the configuration where the master-slave type D flip-flops are used.

The bit number of the shift register 13 is the same as the number of the controlling bit of the analog quantities (six bit in these embodiments), and is not equal to the bit numbers, 24, or the PLA circuit 10 in FIG. 6. Because of this, it becomes necessary to interchange data of the shift register whenever the control signals CL1 and CL2 of the circuit in FIG. 6 are changed. Since, however, it is the mode change of analog quantities to begin with, it is a low speed switching so that no difficulty arises on the occation of the evaluation including noise generated in this process.

As described in the above, according to the semiconductor integrated circuit of the present invention data for obtaining a necessary current value is set by using a shift register, so that it is possible to try various data in a simple manner. Consequently, it is possible to quickly and optimally determine data to be fixed on the mask. Since there is no need for preparing PLAs of all sorts of patterns, the present invention has an effect of reducing the cost drastically.

It is apparent that the present invention is not limited to the above embodiments, but may be modified and changed without departing from the scope and spirit of the invention.

For example, the shift register 13 may be constituted by using the R-S latches as latches in place of the D latches. Moreover, the constitution of the DAC circuit 2 may be of any type, and may be a voltage switching circuit, a current switching circuit, a resistance switching circuit or a capacitance switching circuit, as long as it is a circuit which can supply analog quantities. Furthermore, current mirror circuits are not always necessary. The object of the operation may be a filter, amplification degree, oscillation frequency, phase, or the like.

What is claimed is:

1. A semiconductor integrated circuit device comprising a variable current source producing a variable current, a shift register receiving control data in serial and producing a set of control signals in a parallel form, and a control circuit responding to said set of control signals and causing said variable current source to change a value of said variable current.

2. The device as claimed in claim 1, wherein said variable current source includes a plurality of current sources, one or ones of said current sources are selected in accordance with said set of control signals and outputted as said variable current.

3. The device as claimed in claim 2, wherein said variable current source further includes a plurality of first transistors, and said control circuit includes a plurality of second transistors each cooperating with an associated one of said first transistors to constitute a differential circuit, each of said current sources serving as an corresponding differential circuit.

4. A method of adjusting a current generated by a variable current source incorporated into a semiconductor integrated circuit device, comprising the steps of:
   supplying said data in serial to a shift register, said shift register thereby producing a set of control signals in a parallel form, and
   responding to said set of control signal to change a value of said current generated by said variable current source.

* * * * *